US011286559B2

(12) United States Patent
Lindahl et al.

(10) Patent No.: US 11,286,559 B2
(45) Date of Patent: Mar. 29, 2022

(54) COATED CUTTING TOOL

(71) Applicant: SANDVIK INTELLECTUAL PROPERTY AB, Sandviken (SE)

(72) Inventors: Erik Lindahl, Knivsta (SE); Jan Engqvist, Uppsala (SE)

(73) Assignee: SANDVIK INTELLECTUAL PROPERTY AB, Sandviken (SE)

(*) Notice: Subject to any disclaimer, the term of this patent is extended or adjusted under 35 U.S.C. 154(b) by 89 days.

(21) Appl. No.: 16/619,768

(22) PCT Filed: Jun. 5, 2018

(86) PCT No.: PCT/EP2018/064747
§ 371 (c)(1),
(2) Date: Dec. 5, 2019

(87) PCT Pub. No.: WO2018/224487
PCT Pub. Date: Dec. 13, 2018

(65) Prior Publication Data
US 2020/0095675 A1 Mar. 26, 2020

(30) Foreign Application Priority Data

Jun. 7, 2017 (EP) .................................... 17174801

(51) Int. Cl.
*C23C 16/40* (2006.01)
*B23B 27/14* (2006.01)
*C23C 16/36* (2006.01)

(52) U.S. Cl.
CPC .......... *C23C 16/403* (2013.01); *B23B 27/148* (2013.01); *C23C 16/36* (2013.01); *B23B 2228/04* (2013.01); *B23B 2228/10* (2013.01)

(58) Field of Classification Search
CPC .................. B23B 27/14; B23B 27/148; B23B 2228/04; B23B 2228/10; C23C 16/36; C23C 16/403
(Continued)

(56) References Cited

U.S. PATENT DOCUMENTS 4,746,563 A 5/1988 Nakano et al.
5,700,569 A * 12/1997 Ruppi .................. C23C 16/32
428/336

(Continued)

FOREIGN PATENT DOCUMENTS

EP 2570510 A1 3/2013
JP S586969 A 1/1983
JP 2010-172989 * 8/2010

*Primary Examiner* — Archene A Turner
(74) *Attorney, Agent, or Firm* — Corinne R. Gorski

(57) ABSTRACT

A coated cutting tool includes a substrate and a coating. The coating has an $\alpha$-$Al_2O_3$-multilayer of alternating sublayers of $\alpha$-$Al_2O_3$ and sublayers of TiCO, TiCNO, AlTiCO or AlTiCNO. The $\alpha$-$Al_2O_3$-multilayer includes at least 5 sublayers of $\alpha$-$Al_2O_3$, wherein the total thickness of the $\alpha$-$Al_2O_3$-multilayer is 1-15 μm and wherein a period in the $\alpha$-$Al_2O_3$-multilayer is 50-900 nm. The $\alpha$-$Al_2O_3$-multilayer exhibits an XRD diffraction over a $\theta$-$2\theta$ scan of 20°-140°, wherein the relation of the intensity of the 0 0 12 diffraction peak (peak area), I(0 0 12), to the intensities of the 1 1 3 diffraction peak (peak area), I(1 1 3), the 1 1 6 diffraction peak (peak area), I(1 1 6), and the 0 2 4 diffraction peak (peak area), I(0 2 4), is I(0 0 12)/I(1 1 3)>1, I(0 0 12)/I(1 1 6)>1 and I(0 0 12)/I(0 2 4)>1.

16 Claims, 8 Drawing Sheets

(58) Field of Classification Search
USPC .................... 51/307, 309; 428/698, 701, 702
See application file for complete search history.

(56) References Cited

U.S. PATENT DOCUMENTS

| | | | |
|---|---|---|---|
| 6,333,099 B1* | 12/2001 | Strondl | ................. C23C 28/042 |
| | | | 407/119 |
| 9,365,925 B2 | 6/2016 | Leicht et al. | |
| 2008/0050614 A1* | 2/2008 | Holzschuh | ............ C23C 28/042 |
| | | | 428/698 |
| 2008/0240876 A1 | 10/2008 | Elkouby et al. | |
| 2016/0136786 A1 | 5/2016 | Bjormander | |
| 2018/0369926 A1* | 12/2018 | Kodama | ............. B23B 27/1603 |
| 2019/0039148 A1* | 2/2019 | Kubo | ...................... B23B 27/16 |

* cited by examiner

COATED CUTTING TOOL

RELATED APPLICATION DATA

This application is a § 371 National Stage Application of PCT International Application No. PCT/EP2018/064747 filed Jun. 5, 2018 claiming priority to EP 17174801.5 filed Jun. 7, 2017.

TECHNICAL FIELD OF THE INVENTION

The present invention relates to a coated cutting tool comprising an $\alpha$-$Al_2O_3$-multilayer consisting of alternating sublayers of $\alpha$-$Al_2O_3$ and sublayers of TiCO, TiCNO, AlTiCO or AlTiCNO, said $\alpha$-$Al_2O_3$-multilayer comprises at least 5 sublayers of $\alpha$-$Al_2O_3$, wherein the total thickness of said $\alpha$-$Al_2O_3$-multilayer is 1-15 μm and wherein the period in the $\alpha$-$Al_2O_3$-multilayer is 50-900 nm.

BACKGROUND

In the metal cutting industry coated cutting tools are well known in the art. CVD coated cutting tools and PVD coated cutting tools are the two most dominating types of coated cutting tools. Advantages with these coatings are high resistance to chemical and abrasive wear which are important to achieve long tool life of the coated cutting tool.

CVD coatings comprising a layer of TiCN together with a layer of alumina are known to perform well in for example turning in steel. Multilayers of alumina are for example known from U.S. Pat. No. 9,365,925 B2 disclosing sublayers of alumina separated by a bonding layer comprising both a layer of TiCN and a layer of TiAlOC.

There is a continuous need of finding cutting tool coatings that can prolong the life time of the cutting tool and/or that can withstand higher cutting speeds than the known cutting tool coatings.

SUMMARY OF THE INVENTION

One object of the present invention is to provide a wear resistant coating with improved properties in metal cutting tool applications. It is a further object to provide a wear resistant coating that provides a high crater and flank wear resistance in combination with a high flaking resistance in turning of steel and hardened steel. A further object of the invention is to provide a coating with a combined high crater wear resistance with a high resistance against flaking due to plastic deformation of the cutting edge.

The present disclosure relates to a coated cutting tool comprising a substrate and a coating, wherein the coating comprises an $\alpha$-$Al_2O_3$-multilayer consisting of alternating sublayers of $\alpha$-$Al_2O_3$ and sublayers of TiCO, TiCNO, AlTiCO or AlTiCNO, said $\alpha$-$Al_2O_3$-multilayer comprises at least 5 sublayers of $\alpha$-$Al_2O_3$, wherein the total thickness of said $\alpha$-$Al_2O_3$-multilayer is 1-15 μm and wherein a period in the $\alpha$-$Al_2O_3$-multilayer is 50-900 nm. The $\alpha$-$Al_2O_3$-multilayer exhibits an XRD diffraction over a θ-2θ scan of 20°-140°, wherein the relation of the intensity of the 0 0 12 diffraction peak (peak area), I(0 0 12), to the intensities of the 1 1 3 diffraction peak (peak area), I(1 1 3), the 1 1 6 diffraction peak (peak area), I(1 1 6), and the 0 2 4 diffraction peak (peak area), I(0 2 4), is I(0 0 12)/I(1 1 3)>1, I(0 0 12)/I(1 1 6)>1 and I(0 0 12)/I(0 2 4)>1. In one embodiment the ratio I(0 0 12)/I(1 1 3) is preferably >2, more preferably >3, even more preferably >4. In one embodiment the ratio I(0 0 12)/I(0 2 4) is preferably >2, more preferably >3. No thin film correction is applied to the diffraction data but the data is treated with Cu—$K_{\alpha 2}$ stripping and background fitting as disclosed in more detail below.

It has surprisingly been found that a coated cutting tool provided with a $\alpha$-$Al_2O_3$-multilayer in a coating according to the invention can withstand flaking of the coating due to plastic deformation of the cutting edge in turning operations in steel and hardened steel. This highly orientated $\alpha$-$Al_2O_3$-multilayer of the present invention provides both a high crater wear resistance and a high resistance against flaking.

In one embodiment of the present invention the intensity of the 0 1 14 diffraction peak (peak area), I(0 1 14), to the intensity of the 0 0 12 diffraction peak (peak area), I(0 0 12), is I(0 1 14)/I(0 0 12)<2, preferably <1, more preferably <0.8 or <0.7.

In one embodiment of the present invention the relation of the intensity of the 1 1 0 diffraction peak (peak area), I(1 1 0), to the intensities of the 1 1 3 diffraction peak (peak area), I(1 1 3), and the 0 2 4 diffraction peak (peak area), I(0 2 4), is I(110)>each of I(113) and I(024).

In one embodiment of the present invention the relation of the intensity of the 0 0 12 diffraction peak (peak area), I(0 0 12), to the intensity of the 1 1 0 diffraction peak (peak area), I(1 1 0), is I(0 0 12)>I(110).

In one embodiment of the present invention the TiCO, TiCNO, AlTiCO or AlTiCNO sublayer comprises protrusions, wherein the protrusions are crystalline.

In one embodiment of the present invention said protrusions comprise at least one twin boundary, preferably the protrusions share a (111) plane and are extended in its <211> direction. In one embodiment the crystal structure of said protrusions are cubic.

In one embodiment of the present invention the length of said protrusions in its extended direction is 10-100 nm.

In one embodiment of the present invention the height of said protrusions as measured in a direction perpendicular to the surface normal of the substrate is less than a period of the multilayer, preferably less than 80% of the period of the multilayer, more preferably less than or equal to 50% of the period of the multilayer.

The protrusions are considered to be important for the adhesion between the sublayers of the $\alpha$-$Al_2O_3$-multilayer. A good adhesion is necessary to withstand the high wear during cutting operations.

A high orientation throughout the $\alpha$-$Al_2O_3$-multilayer is considered important to provide the high flank and crater wear resistance. The high degree of orientation of one $\alpha$-$Al_2O_3$-sublayer of the $\alpha$-$Al_2O_3$-multilayer is continued through a TiCO, TiCNO, AlTiCO or AlTiCNO sublayer.

The average height of said protrusions is preferably less than a period of the $\alpha$-$Al_2O_3$-multilayer. The wear resistance of the $\alpha$-$Al_2O_3$-multilayer will decrease if the $\alpha$-$Al_2O_3$-sublayer is not continuous.

In one embodiment of the present invention the average thickness of said $\alpha$-$Al_2O_3$ sublayer is 40-800 nm, preferably 80-700 nm, more preferably 100-500 nm or 100-300 nm. The $\alpha$-$Al_2O_3$ sublayer should be of a sufficient thickness to provide a high wear resistance but small enough to provide the advantages of a multilayer. If the $\alpha$-$Al_2O_3$ sublayer is of a too large thickness it will appear as a single layer without the advantages of being a multilayer. The $\alpha$-$Al_2O_3$-multilayer of the present invention provides a higher resistance against flaking at plastic deformation of the cutting edge and a higher resistance to plastic deformation of the cutting edge as compared to a coating with a single $\alpha$-$Al_2O_3$-layer.

In one embodiment of the present invention the coated cutting tool comprises a first $\alpha$-$Al_2O_3$-layer located between the substrate and the α-Al$_2$O$_3$-multilayer, wherein the thickness of said first α-Al$_2$O$_3$-layer is <1 μm, preferably <0.5 μm, more preferably <0.3 μm or 100-300 nm. It has been found that the first α-Al$_2$O$_3$-layer located between the substrate and the α-Al$_2$O$_3$-multilayer is important to provide a high resistance against flaking at plastic deformation of the cutting edge. In one embodiment the first α-Al$_2$O$_3$-layer is of the same thickness as one of the α-Al$_2$O$_3$-sublayers of the α-Al$_2$O$_3$-multilayer.

In one embodiment of the present invention the coated cutting tool comprises at least one layer of TiC, TiN, TiAlN or TiCN located between the substrate and the α-Al$_2$O$_3$-multilayer, preferably TiCN. In one embodiment of the present invention the thickness of the TiC, TiN, TiAlN or TiCN layer is 2-15 μm.

In one embodiment of the present invention the outermost layer of the coating is an α-Al$_2$O$_3$ layer. Alternatively, one or more further layers can cover the α-Al$_2$O$_3$ layer, such as layers of TiN, TiC, Al$_2$O$_3$ and/or combinations thereof. In one embodiment of the present invention said one or more further layers covering the α-Al$_2$O$_3$ layer is/are removed from the flank face or the rake face or the cutting edge or combinations thereof.

In one embodiment of the present invention the substrate is of cemented carbide, cermet, ceramic, high speed steel or cBN. The substrate should have hardness and toughness that suit the coating of the present invention.

In one embodiment of the present invention the substrate is of cemented carbide comprising 3-14 wt % Co and more than 50 wt % WC. In one embodiment of the present invention the substrate of the coated cutting tool consists of cemented carbide comprising 4-12 wt % Co, preferably 6-8 wt % Co, optionally 0.1-10 wt % cubic carbides, nitrides or carbonitrides of metals from groups IVb, Vb and VIb of the periodic table, preferably Ti, Nb, Ta or combinations thereof, and balance WC.

Still other objects and features of the present invention will become apparent from the following detailed description considered in conjunction with the accompanying drawings.

DEFINITIONS

Figure 1:
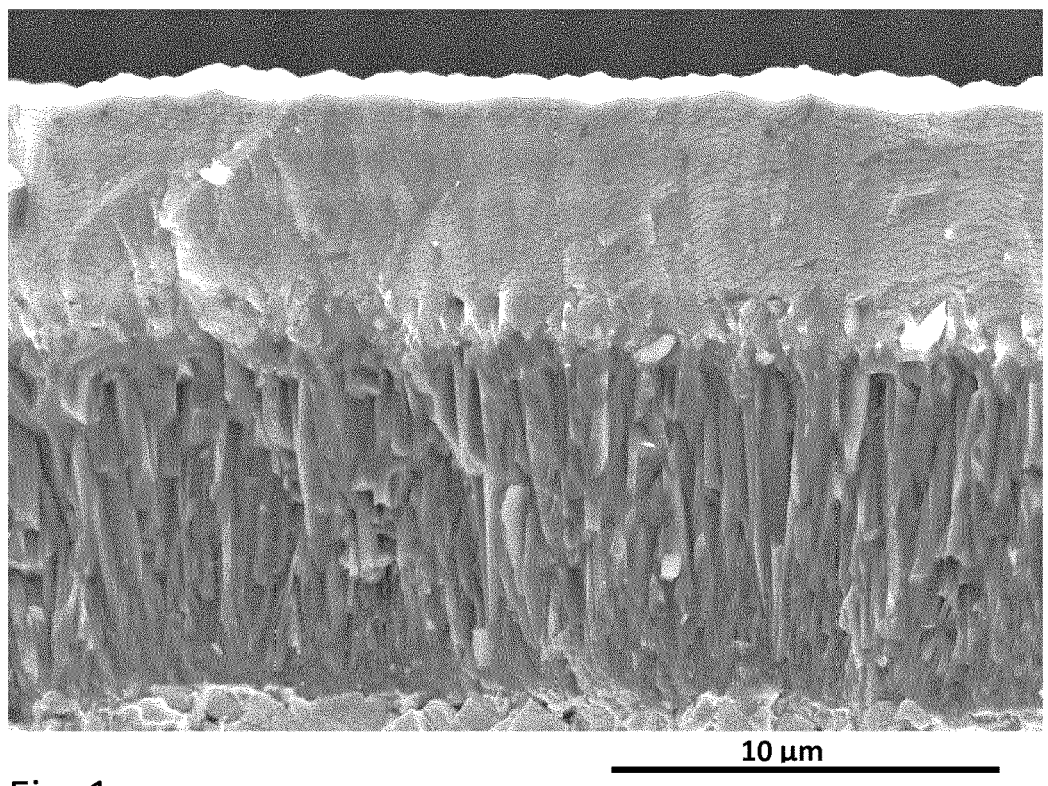
FIG. 1 is a Scanning Electron Microscope (SEM) image of a fractured cross section of the coating of sample Multi A24. The columnar TiCN layer is visible below the α-Al$_2$O$_3$-multilayer.
Figure 2:
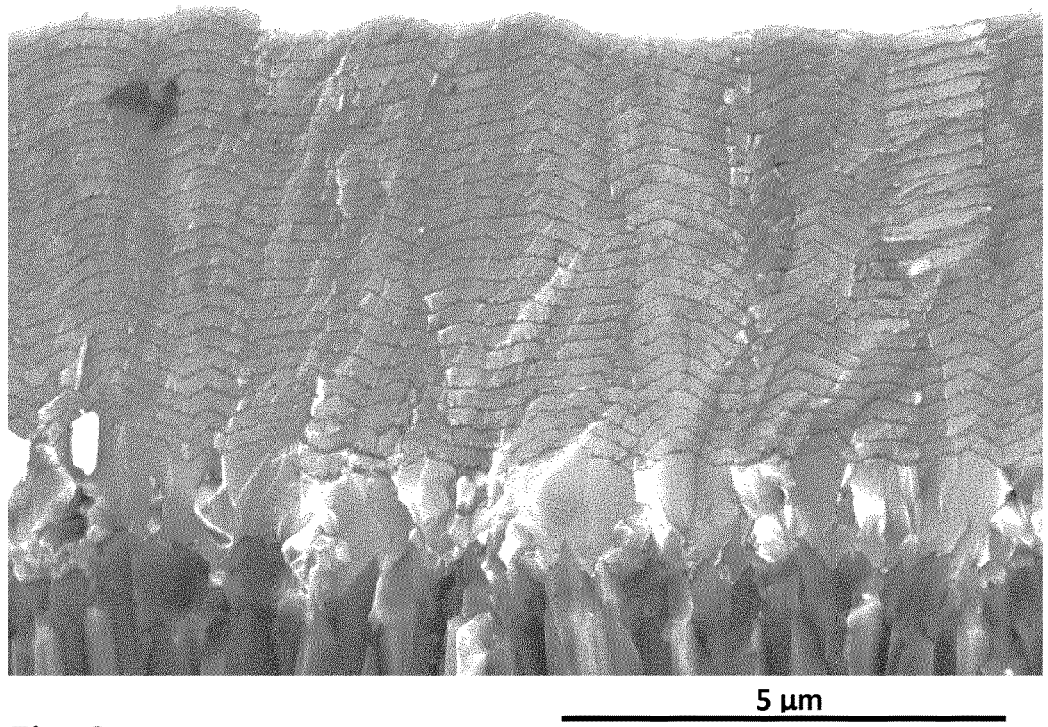
FIG. 2 is a Scanning Electron Microscope (SEM) image of a fractured cross section of the α-Al$_2$O$_3$-multilayer of sample Multi A24. The 1 μm α-Al$_2$O$_3$-layer is visible below the α-Al$_2$O$_3$-multilayer.
Figure 3:
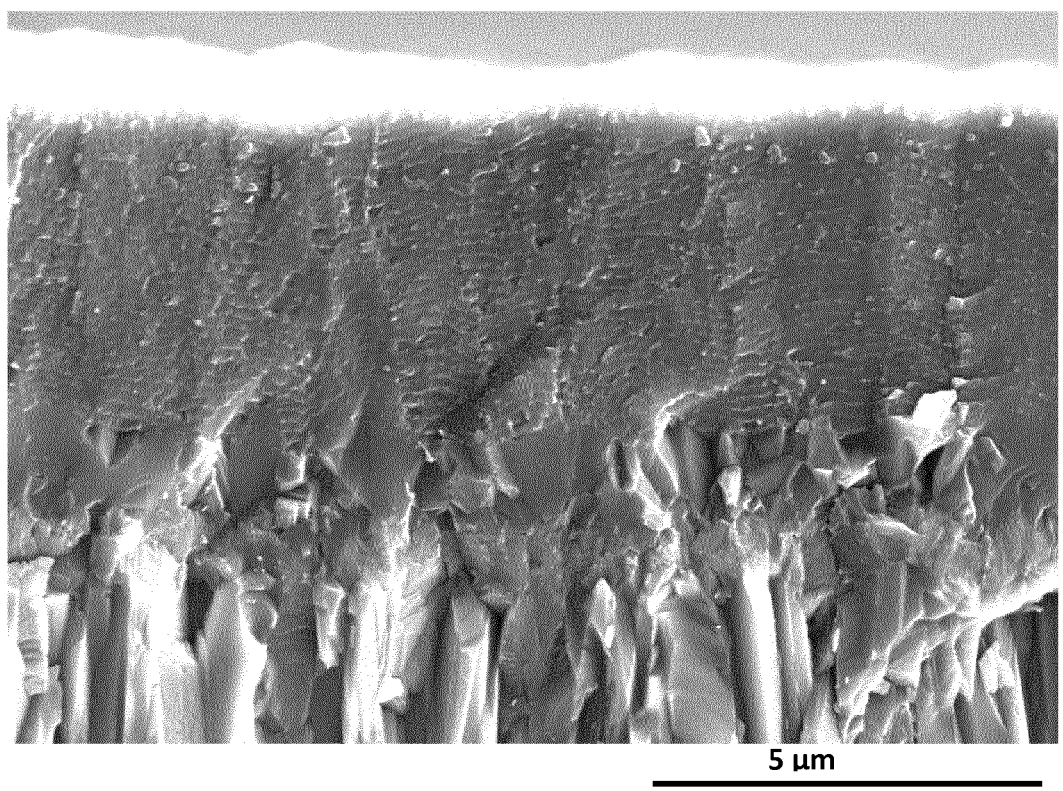
FIG. 3 is a Scanning Electron Microscope (SEM) image of a fractured cross section of the coating of sample Multi A32. The 1 μm α-Al$_2$O$_3$-layer is visible below the α-Al$_2$O$_3$-multilayer.
Figure 4:
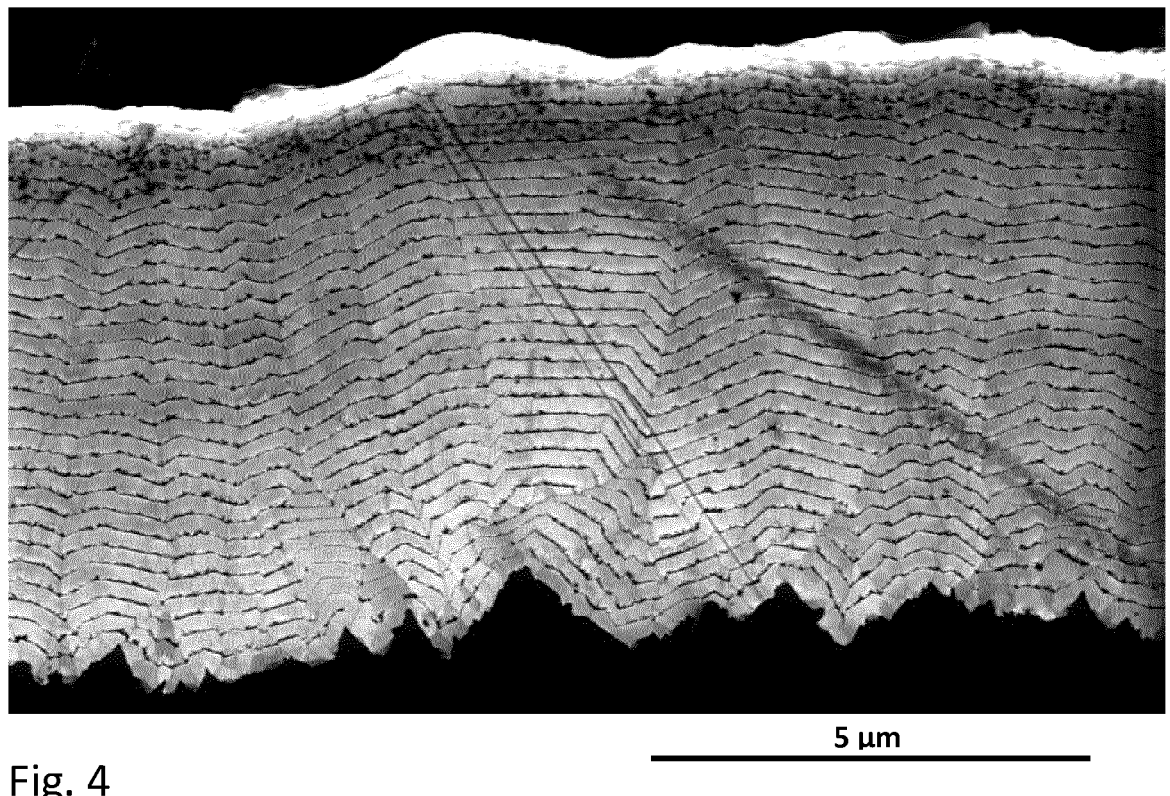
FIG. 4 is a Scanning Electron Microscope (SEM) image of a polished cross section of the α-Al$_2$O$_3$-multilayer of sample Multi A28u.
Figure 5:
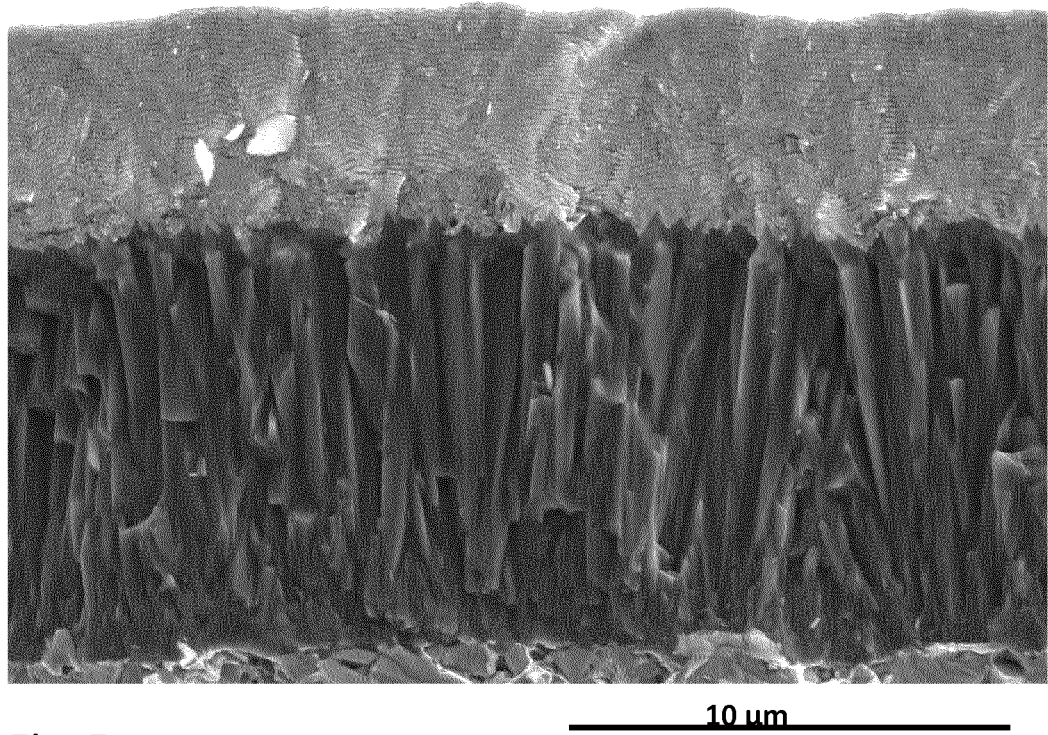
FIG. 5 is a Scanning Electron Microscope (SEM) image of a fractured cross section of the sample Multi A40u.
Figure 6:
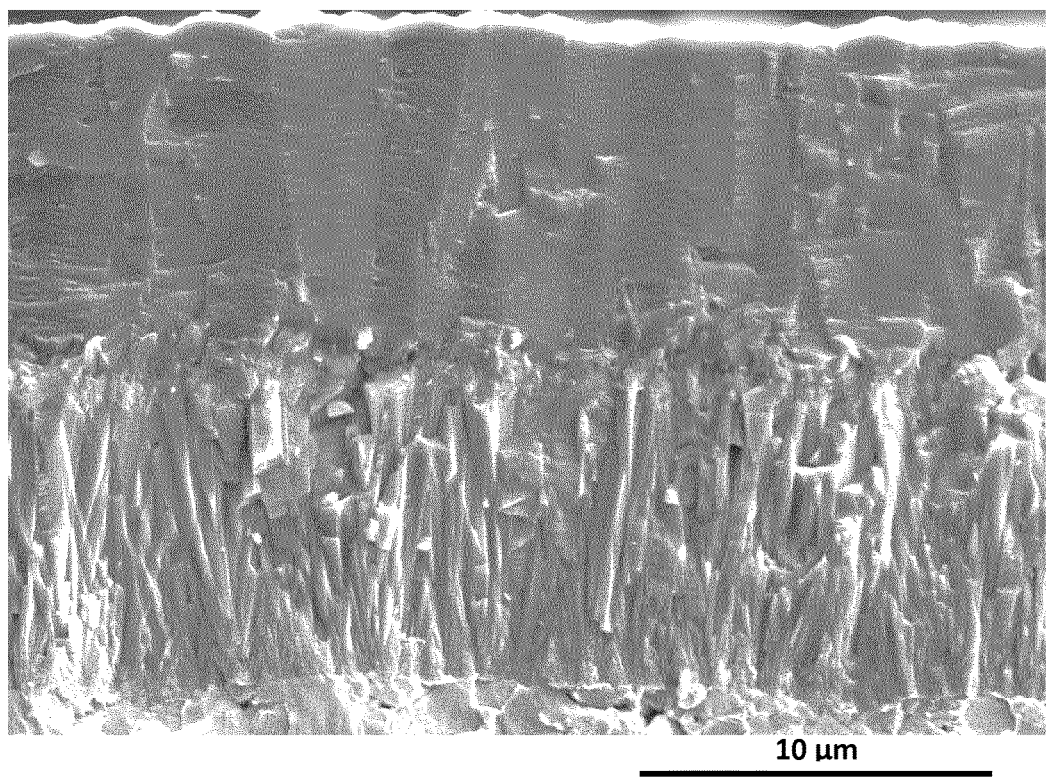
FIG. 6 is a Scanning Electron Microscope (SEM) image of a fractured cross section of the coating of sample Multi B38.
Figure 7:
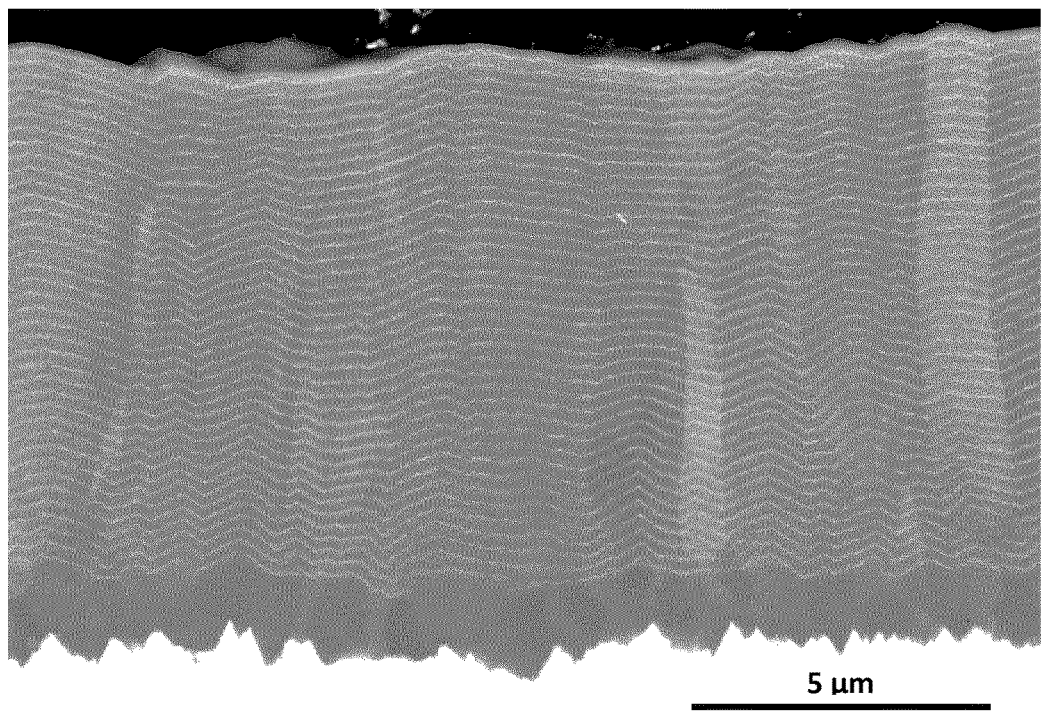
FIG. 7 is a Scanning Electron Microscope (SEM) image of a polished cross section of the α-Al$_2$O$_3$-multilayer of sample Multi B38. The 1 μm α-Al$_2$O$_3$-layer is visible below the α-Al$_2$O$_3$-multilayer.
Figure 8:
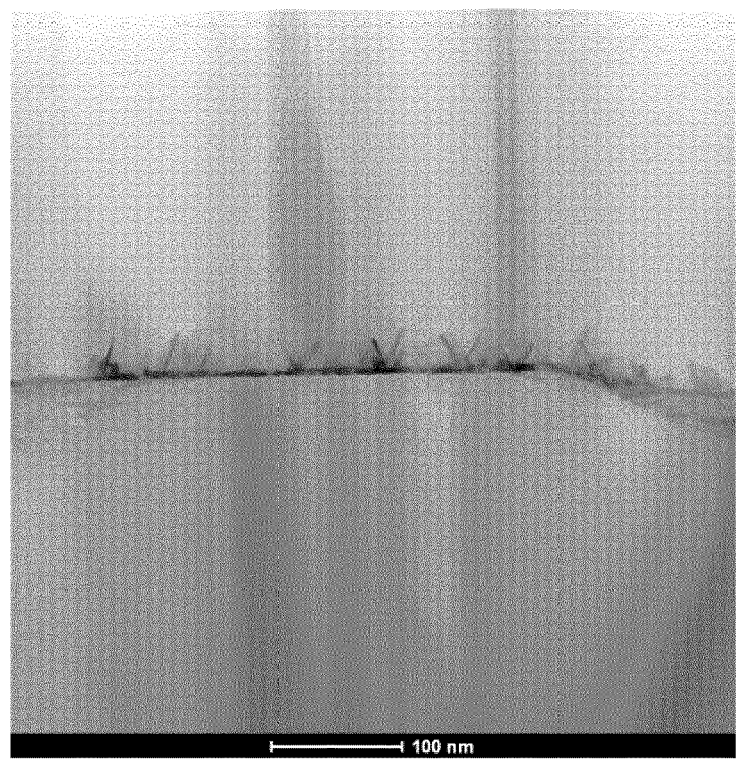
FIG. 8 is a Bright Field Scanning Transmission Electron Microscope (STEM) image of a cross section of a TiCO sublayer between two α-Al$_2$O$_3$-sublayers.
Figure 9:
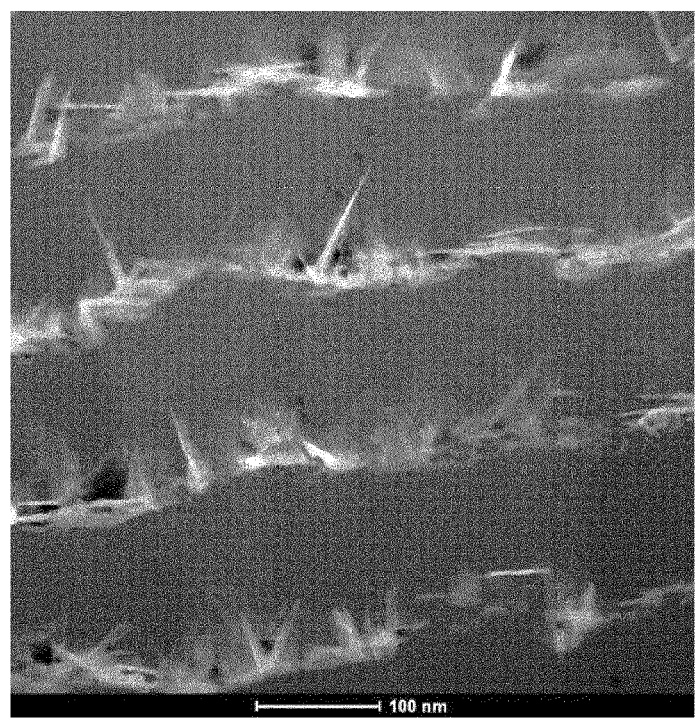
FIG. 9 is a HAADF Scanning Transmission Electron Microscope (HAADF STEM) image of a cross section of a portion of the α-Al$_2$O$_3$-multilayer of the coating of sample Multi A32.

The abbreviation "cutting tool" is herein intended to denote cutting tool inserts, end mills or drills. The application areas are metal cutting applications and can for example be turning, milling or drilling.

Methods

XRD Analysis

In order to investigate the texture or orientation of the layer(s) X-ray diffraction (XRD) was conducted on the flank face using a PANalytical CubiX3 diffractometer equipped with a PIXcel detector. The coated cutting tools were mounted in sample holders to ensure that the flank face of the samples are parallel to the reference surface of the sample holder and also that the flank face is at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°. The data analysis, including background fitting, Cu—K$_{\alpha 2}$ stripping and profile fitting of the data, was done using PANalytical's X'Pert HighScore Plus software. The output (integrated peak areas for the profile fitted curve) from this program was then used to define the coating of the present invention in terms of intensity ratios and/or relations.

Normally a so called thin film correction is to be applied to the integrated peak area data to compensate for differences in intensities due to absorption and different path lengths in layers, but since the TiCO, TiCNO, AlTiCO or AlTiCNO sublayer of the present invention comprise protrusions the thickness of this layer is not trivial to set and the path length through this layer is complex. The orientation of the multilayer is therefore set based on data without thin film correction applied to the extracted integrated peak area intensities for the profile fitted curve. Cu—K$_{\alpha 2}$ stripping is however applied to the data before the intensity areas are calculated.

Since possible further layers above the α-Al$_2$O$_3$-multilayer will affect the X-ray intensities entering the α-Al$_2$O$_3$-multilayer and exiting the whole coating, corrections need to be made for these, taken into account the linear absorption coefficient for the respective compound in a layer. Alternatively, a further layer, above the α-Al$_2$O$_3$-multilayer can be removed by a method that does not substantially influence the XRD measurement results, e.g. chemical etching.

It is to be noted that peak overlap is a phenomenon that can occur in X-ray diffraction analysis of coatings comprising for example several crystalline layers and/or that are deposited on a substrate comprising crystalline phases, and this has to be considered and compensated for by the skilled person. A peak overlap of peaks from the α-Al$_2$O$_3$ layer with peaks from the TiCN layer might influence measurement and needs to be considered. It is also to be noted that for example WC in the substrate can have diffraction peaks close to the relevant peaks of the present invention.

STEM Analysis

In order to investigate the protrusions of the sublayer, STEM analysis was made in a monochromated, aberration probe corrected Titan 80-300 TEM/STEM.

To prepare a specimen of a sample for STEM analysis a dual focused ion beam system was used, FEI VERSA3D LoVac (Versa). A Pt strip was deposited on the surface of the sample, a specimen was cut out into the sample using ion beam. An omniprobe was welded to the PT strip, thereafter the specimen was cut free from the sample and welded to a support grid made of copper. The specimen was thereafter thinned down using the ion beam to a thickness of 80-100 nm. A voltage of 30 kV and three different currents were used for thinning down the specimen. A current of 1 nA was used to thin down the sample to around 400 nm thickness. The specimen was tilted ±2 degrees relative the ion beam during thinning. A current of 0.3 nA was used to thin down the sample to around 200 nm thickness. The specimen was tilted ±1.5 degrees relative the ion beam during thinning. A current of 0.1 nA was used to thin down the sample to around 100 nm thickness. The specimen was tilted ±1.2 degrees relative the ion beam during thinning. After thinning down the specimen to around 100 nm the sides of the specimen were cleaned using low kV ions to remove amorphous material. The first cleaning step was done using a voltage of 5 kV and a current of 48 pA. The specimen was inclined ±5 degrees relative the ion beam during cleaning and each side was cleaned for 2 minutes. The second cleaning step was done using a voltage of 2 kV and a current of 27 pA. The specimen was inclined ±7 degrees relative the ion beam during cleaning and each side was cleaned for 30 seconds.

The analyse of the protrusions can be done using HAADF STEM. In the analyse of the protrusions an initial step is to align the protrusions based on their respective Kikuchi pattern. The crystal structure of the protrusions is handled as cubic (see for example PDF 00-050-0681 for TiCNO) and each protrusion is to be oriented along a known zone axis, such as its 011 zone axis, before conclusions about the crystallographic extension of the protrusions is to be drawn. The orientation of the twin boundary can then be identified as well as the direction of the extension of the protrusion by Fourier transforms of the data (fast Fourier transform).

DETAILED DESCRIPTION OF THE INVENTION

The present disclosure relates to a coated cutting tool comprising a substrate and a coating, wherein the coating comprises an α-Al$_2$O$_3$-multilayer consisting of alternating sublayers of α-Al$_2$O$_3$ and sublayers of TiCO, TiCNO, AlTiCO or AlTiCNO, said α-Al$_2$O$_3$-multilayer comprises at least 5 sublayers of α-Al$_2$O$_3$, wherein the total thickness of said α-Al$_2$O$_3$-multilayer is 1-15 μm and wherein a period in the α-Al$_2$O$_3$-multilayer is 50-900 nm. The α-Al$_2$O$_3$-multilayer exhibits an XRD diffraction over a θ-2θ scan of 20°-140°, wherein the relation of the intensity of the 0 0 12 diffraction peak (peak area), I(0 0 12), to the intensities of the 1 1 3 diffraction peak (peak area), I(1 1 3), the 1 1 6 diffraction peak (peak area), I(1 1 6), and the 0 2 4 diffraction peak (peak area), I(0 2 4), is I(0 0 12)/I(1 1 3)>1, I(0 0 12)/I(1 1 6)>1 and I(0 0 12)/I(0 2 4)>1. In one embodiment the ratio I(0 0 12)/I(1 1 3) is preferably >2, more preferably >3, even more preferably >4. In one embodiment the ratio I(0 0 12)/I(0 2 4) is preferably >2, more preferably >3. No thin film correction is applied to the diffraction data but the data is treated with Cu—K$_{\alpha 2}$ stripping and background fitting as disclosed in more detail below.

It has surprisingly been found that a coated cutting tool provided with a α-Al$_2$O$_3$-multilayer in a coating according to the invention can withstand flaking of the coating due to plastic deformation of the cutting edge in turning operations in steel and hardened steel. This highly orientated α-Al$_2$O$_3$-multilayer of the present invention provides both a high crater wear resistance and a high resistance against flaking.

In one embodiment of the present invention the intensity of the 0 1 14 diffraction peak (peak area), I(0 1 14), to the intensity of the 0 0 12 diffraction peak (peak area), I(0 0 12), is I(0 1 14)/I(0 0 12)<2, preferably <1, more preferably <0.8 or <0.7.

In one embodiment of the present invention the relation of the intensity of the 1 1 0 diffraction peak (peak area), I(1 1 0), to the intensities of the 1 1 3 diffraction peak (peak area), I(1 1 3), and the 0 2 4 diffraction peak (peak area), I(0 2 4), is I(110)>each of I(113) and I(024).

In one embodiment of the present invention the relation of the intensity of the 0 0 12 diffraction peak (peak area), I(0 0 12), to the intensity of the 1 1 0 diffraction peak (peak area), I(1 1 0), is I(0 0 12)>I(110).

In one embodiment of the present invention the TiCO, TiCNO, AlTiCO or AlTiCNO sublayer comprises protrusions, wherein the protrusions are crystalline.

In one embodiment of the present invention said protrusions comprise at least one twin boundary, preferably the protrusions share a (111) plane and are extended in its <211> direction. In one embodiment the crystal structure of said protrusions are cubic.

In one embodiment of the present invention the length of said protrusions in its extended direction is 10-100 nm.

In one embodiment of the present invention the height of said protrusions as measured in a direction perpendicular to the surface normal of the substrate is less than a period of the multilayer, preferably less than 80% of the period of the multilayer, more preferably less than or equal to 50% of the period of the multilayer.

The protrusions are considered to be important for the adhesion between the sublayers of the α-Al$_2$O$_3$-multilayer. A good adhesion is necessary to withstand the high wear during cutting operations.

A high orientation throughout the α-Al$_2$O$_3$-multilayer is considered important to provide the high flank and crater wear resistance. The high degree of orientation of one α-Al$_2$O$_3$-sublayer of the α-Al$_2$O$_3$-multilayer is continued through a TiCO, TiCNO, AlTiCO or AlTiCNO sublayer.

The average height of said protrusions is preferably less than a period of the α-Al$_2$O$_3$-multilayer. The wear resistance of the α-Al$_2$O$_3$-multilayer will decrease if the α-Al$_2$O$_3$-sublayer is not continuous.

In one embodiment of the present invention the average thickness of said α-Al$_2$O$_3$ sublayer is 40-800 nm, preferably 80-700 nm, more preferably 100-500 nm or 100-300 nm. The α-Al$_2$O$_3$ sublayer should be of a sufficient thickness to provide a high wear resistance but small enough to provide the advantages of a multilayer. If the α-Al$_2$O$_3$ sublayer is of a too large thickness it will appear as a single layer without the advantages of being a multilayer. The α-Al$_2$O$_3$-multilayer of the present invention provides a high resistance against flaking at plastic deformation of the cutting edge and a higher resistance to plastic deformation of the cutting edge as compared to a coating with a single α-Al$_2$O$_3$-layer.

In one embodiment of the present invention the coated cutting tool comprises a first α-Al$_2$O$_3$-layer located between the substrate and the α-Al$_2$O$_3$-multilayer, wherein the thickness of said first α-Al$_2$O$_3$-layer is <1 μm, preferably <0.5 μm, more preferably <0.3 μm or 100-300 nm. It has been found that the first α-Al$_2$O$_3$-layer located between the substrate and the α-Al$_2$O$_3$-multilayer is important to provide a high resistance against flaking at plastic deformation of the cutting edge. In one embodiment the first α-Al$_2$O$_3$-layer is of the same thickness as one of the α-Al$_2$O$_3$-sublayers of the α-Al$_2$O$_3$-multilayer.

In one embodiment of the present invention the coated cutting tool comprises at least one layer of TiC, TiN, TiAlN or TiCN located between the substrate and the α-Al$_2$O$_3$-multilayer, preferably TiCN. In one embodiment of the present invention the thickness of the TiC, TiN, TiAlN or TiCN layer is 2-15 μm.

In one embodiment of the present invention the outermost layer of the coating is an α-Al$_2$O$_3$ layer. Alternatively, one or more further layers can cover the α-Al$_2$O$_3$ layer, such as layers of TiN, TiC, Al$_2$O$_3$ and/or combinations thereof. In one embodiment of the present invention said one or more further layers covering the α-Al$_2$O$_3$ layer is/are removed from the flank face or the rake face or the cutting edge or combinations thereof.

In one embodiment of the present invention the substrate is of cemented carbide, cermet, ceramic, high speed steel or cBN. The substrate should have hardness and toughness that suit the coating of the present invention.

In one embodiment of the present invention the substrate is of cemented carbide comprising 3-14 wt % Co and more than 50 wt % WC. In one embodiment of the present invention the substrate of the coated cutting tool consists of cemented carbide comprising 4-12 wt % Co, preferably 6-8 wt % Co, optionally 0.1-10 wt % cubic carbides, nitrides or carbonitrides of metals from groups IVb, Vb and VIb of the periodic table, preferably Ti, Nb, Ta or combinations thereof, and balance WC.

In one embodiment of the present invention the substrate consists of cemented carbide with a binder phase enriched surface zone. The thickness of the binder phase enriched surface zone is preferably 5-35 μm as measured from the surface of the substrate and towards the core of the substrate. The binder phase enriched zone has in average a binder phase content at least 50% higher than the binder phase content in the core of the substrate. A binder phase enriched surface zone enhances the toughness of the substrate. A substrate with a high toughness is preferred in cutting operations such as turning of steel.

In one embodiment of the present invention the substrate consists of cemented carbide with a surface zone essentially free from cubic carbides. The thickness of the surface zone essentially free from cubic carbides is preferably 5-35 μm as measured from the surface of the substrate and towards the core of the substrate. By "essentially free" means that no cubic carbides is visible in an ocular analyse of a cross section in a light optical microscope.

In one embodiment of the present invention the substrate consists of a cemented carbide with a binder phase enriched surface zone as disclosed above in combination with a surface zone essentially free from cubic carbides as disclosed above.

In one embodiment of the present invention the coating is post treated by shot peening, blasting or brushing to release tensile stresses of the CVD coated layers and to reduce the surface roughness.

In one embodiment of the present invention the coated cutting tool comprises a layer of TiCN located between the substrate and the α-Al$_2$O$_3$-multilayer and wherein said TiCN layer exhibits a texture coefficient TC(hkl), as measured by X-ray diffraction using CuKα radiation and θ-2θ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (integrated area) of the (hkl) reflection, I$_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0), (4 2 2) and (5 1 1) exhibits a TC(4 2 2)≥3, preferably 3.5.

In one embodiment of the present invention the coated cutting tool comprises the following layers from the substrate and towards the outer surface of the coating: TiN, TiCN, α-Al$_2$O$_3$, an α-Al$_2$O$_3$-multilayer of alternating sublayers of TiCO and sublayers of α-Al$_2$O$_3$.

In one embodiment of the present invention the total coating thickness is 7-25 μm and the α-Al$_2$O$_3$-multilayer comprises 10-150 sublayers of α-Al$_2$O$_3$. The thickness of the α-Al$_2$O$_3$-multilayer is preferably 3-15 μm. This multilayer is preferred in turning applications.

In one embodiment of the present invention the total coating thickness is 2-9 μm and the α-Al$_2$O$_3$-multilayer comprises 5-70 sublayers of α-Al$_2$O$_3$. The thickness of the α-Al$_2$O$_3$-multilayer is preferably 1-5 μm. This multilayer is preferred in milling or drilling applications The coated cutting tools described herein can be subjected to post-treatments such as blasting, brushing or shot peening in any combination. A blasting post-treatment can be wet blasting or dry blasting for example using alumina particles.

EXAMPLES

Exemplifying embodiments of the present invention will now be disclosed in more detail and compared to reference embodiments. Coated cutting tools (inserts) were manufactured, analyzed and evaluated in cutting tests.

Sample Overview

Cemented carbide substrates were manufactured utilizing conventional processes including milling, mixing, spray drying, pressing and sintering. The sintered substrates were CVD coated in a radial CVD reactor of Ion bond Type size 530 capable of housing 10.000 half inch size cutting inserts. The ISO-type geometry of the cemented carbide substrates (inserts) were CNMG-120408-PM. The composition of the cemented carbide of the samples Single A1, Multi A6, Multi A24, Multi A26, Multi A32, Multi A56, Multi A28u and Multi A40u was 7.2 wt % Co, 2.9 wt % TaC, 0.5 wt % NbC, 1.9 wt % TiC, 0.4 wt % TiN and the rest WC. The composition of the cemented carbide of the samples Multi B38 and Multi B58 was 7.5 wt % Co, 2.9 wt % TaC, 0.5 wt % NbC, 1.9 wt % TiC, 0.4 wt % TiN and the rest WC. An overview of the samples is shown in Table 1.

TABLE 1

Sample overview

| Sample | Coating layout above TiN + TiCN + bonding layers |
|---|---|
| Single A1 | $\alpha\text{-}Al_2O_3$ |
| Multi A6 | $\alpha\text{-}Al_2O_3/(TiCO + \alpha\text{-}Al_2O_3)_6$ |
| Multi A24 | $\alpha\text{-}Al_2O_3/(TiCO + \alpha\text{-}Al_2O_3)_{24}$ |
| Multi A26 | $\alpha\text{-}Al_2O_3/(TiCO + \alpha\text{-}Al_2O_3)_{26}$ |
| Multi A32 | $\alpha\text{-}Al_2O_3/(TiCO + \alpha\text{-}Al_2O_3)_{32}$ |
| Multi A56 | $\alpha\text{-}Al_2O_3/(TiCO + \alpha\text{-}Al_2O_3)_{56}$ |
| Multi A28u | $\alpha\text{-}Al_2O_3/(TiCO + \alpha\text{-}Al_2O_3)_{28}$ |
| Multi A40u | $\alpha\text{-}Al_2O_3/(TiCO + \alpha\text{-}Al_2O_3)_{40}$ |
| Single B1 | $\alpha\text{-}Al_2O_3$ |
| Multi B38 | $\alpha\text{-}Al_2O_3/(TiCO + \alpha\text{-}Al_2O_3)_{38}$ |
| Multi B58 | $\alpha\text{-}Al_2O_3/(TiCO + \alpha\text{-}Al_2O_3)_{58}$ |

CVD Deposition

A first innermost coating of about 0.4 µm TiN was deposited on all substrates in a process at 400 mbar and 885° C. A gas mixture of 48.8 vol % $H_2$, 48.8 vol % $N_2$ and 2.4 vol % $TiCl_4$ was used.

Thereafter an about 7-7.5 µm thick TiCN was deposited in two steps, an inner TiCN and an outer TiCN.

The inner TiCN was deposited for 10 minutes at 55 mbar at 885° C. in a gas mixture of, 3.0 vol % $TiCl_4$, 0.45 vol % $CH_3CN$, 37.6 vol % $N_2$ and balance $H_2$.

The outer TiCN was deposited at 55 mbar at 885° C. in a gas mixture of 7.8 vol % $N_2$, 7.8 vol % HCl, 2.4 vol % $TiCl_4$, 0.65 vol % $CH_3CN$ and balance $H_2$.

On top of the MTCVD TiCN layer a 1-1.5 µm thick bonding layer was deposited at 1000° C. by a process consisting of four separate reaction steps.

First a HTCVD TiCN was deposited at 400 mbar, using a gas mixture of 1.5 vol % $TiCl_4$, 3.4 vol % $CH_4$, 1.7% HCl, 25.5 vol % $N_2$ and 67.9 vol % $H_2$.

The three next steps were all deposited at 70 mbar. In the first (TiCNO-1) a gas mixture of 1.5 vol % $TiCl_4$, 0.40 vol % $CH_3CN$, 1.2 vol % CO, 1.2 vol % HCl, 12.0 vol % $N_2$ and balance $H_2$ was used. The next step (TiCNO-2) used a gas mixture of 3.1 vol % $TiCl_4$, 0.63 vol % $CH_3CN$, 4.6 vol % CO, 30.6 vol % $N_2$ and balance $H_2$. In the last bonding layer step (TiN) a gas mixture of 3.2 vol % $TiCl_4$, 32.3% vol % $N_2$ and 64.5 vol % $H_2$ was used.

Prior to the start of the subsequent $Al_2O_3$ nucleation, the bonding layer was oxidized for 4 minutes in a mixture of $CO_2$, CO, $N_2$ and $H_2$.

On all samples, an $\alpha\text{-}Al_2O_3$-layer was deposited on top of the bonding layer at 1000° C. and 60 mbar in two steps. The first step contained a gas mixture of 1.2 vol % $AlCl_3$, 4.7 vol % $CO_2$, 1.8 vol % HCl and balance $H_2$, and a second step contained a gas mixture of 1.2 vol % $AlCl_3$, 4.7 vol % $CO_2$, 2.9 vol % HCl, 0.58 vol % $H_2S$ and balance $H_2$.

On sample Single A1 this layer was grown to approximately 5 µm, on sample Single B1 to approximately 9 µm.

On samples Multi A6, Multi A24, Multi A26, Multi A32, Multi A56, Multi B38 and Multi B58 this layer were grown to approximately 1 µm.

On samples Multi A28u and Multi A40u this layer were grown to approximately 0.2 and 0.1 µm, respectively.

An $\alpha\text{-}Al_2O_3$-multilayer was deposited on samples Multi A6, Multi A24, Multi A26, Multi A32, Multi A56, Multi A28u, Multi A40u, Multi B38 and Multi B58 wherein a bonding sublayer of TiCO was alternated with a sublayer of $\alpha\text{-}Al_2O_3$. The TiCO sublayer was for all examples deposited for 75 seconds. It was deposited at 1000° C. and 60 mbar in a gas mixture of 1.7 vol % $TiCl_4$, 3.5 vol % CO, 4.3 vol % $AlCl_3$ and 90.5 vol % $H_2$. The $\alpha\text{-}Al_2O_3$ sublayer was deposited in two steps using identical process parameters as for the bottom $\alpha\text{-}Al_2O_3$ layer. The first step was performed for 2.5 minutes and the process time of the second step was adjusted to reach the period thickness of the multilayer in each samples.

One period is equal to the sum of the thickness of one TiCO bonding sublayer and the thickness of one $\alpha\text{-}Al_2O_3$ sublayer. The measurement of the period in the $\alpha\text{-}Al_2O_3$-multilayers of the samples was made by dividing the total thickness of the $\alpha\text{-}Al_2O_3$-multilayer with the number of periods in the layer.

The thicknesses of the layers of the samples were studied in a light optical microscope and in an SEM and are shown on Table 2.

TABLE 2

Layer thicknesses

| Sample | TiN + TiCN + bonding layer [µm] | Single $\alpha$-$Al_2O_3$ [µm] | Multi $\alpha$-$Al_2O_3$ [µm] (TiCO + $\alpha$-$Al_2O_3$)$_x$ | Period in multi-$\alpha$-$Al_2O_3$ [µm] | Total coating thickness [µm] |
|---|---|---|---|---|---|
| Single A1 | 9.1 | 5.1 | — | — | 14.2 |
| Multi A6 | 8.8 | 1 | 5.1 (X = 6) | 0.85 | 14.9 |
| Multi A24 | 8.7 | 1 | 5.0 (X = 24) | 0.21 | 14.7 |
| Multi A26 | 9.0 | 1 | 4.9 (X = 26) | 0.19 | 14.9 |
| Multi A32 | 8.9 | 1 | 4.4 (X = 32) | 0.14 | 14.3 |
| Multi A56 | 8.9 | 1 | 4.3 (X = 56) | 0.077 | 14.4 |
| Multi A28u | 8.9 | 0.2 | 6.1 (X = 28) | 0.21 | 15.2 |
| Multi A40u | 9.3 | 0.1 | 5.1 (X = 40) | 0.13 | 14.5 |
| Single B1 | 8.6 | 9.1 | — | — | 17.7 |
| Multi B38 | 8.7 | 1 | 8.3 (X = 38) | 0.21 | 18.0 |
| Multi B58 | 8.9 | 1 | 7.9 (X = 58) | 0.14 | 17.8 |

XRD Analyze Results

Figure 12:
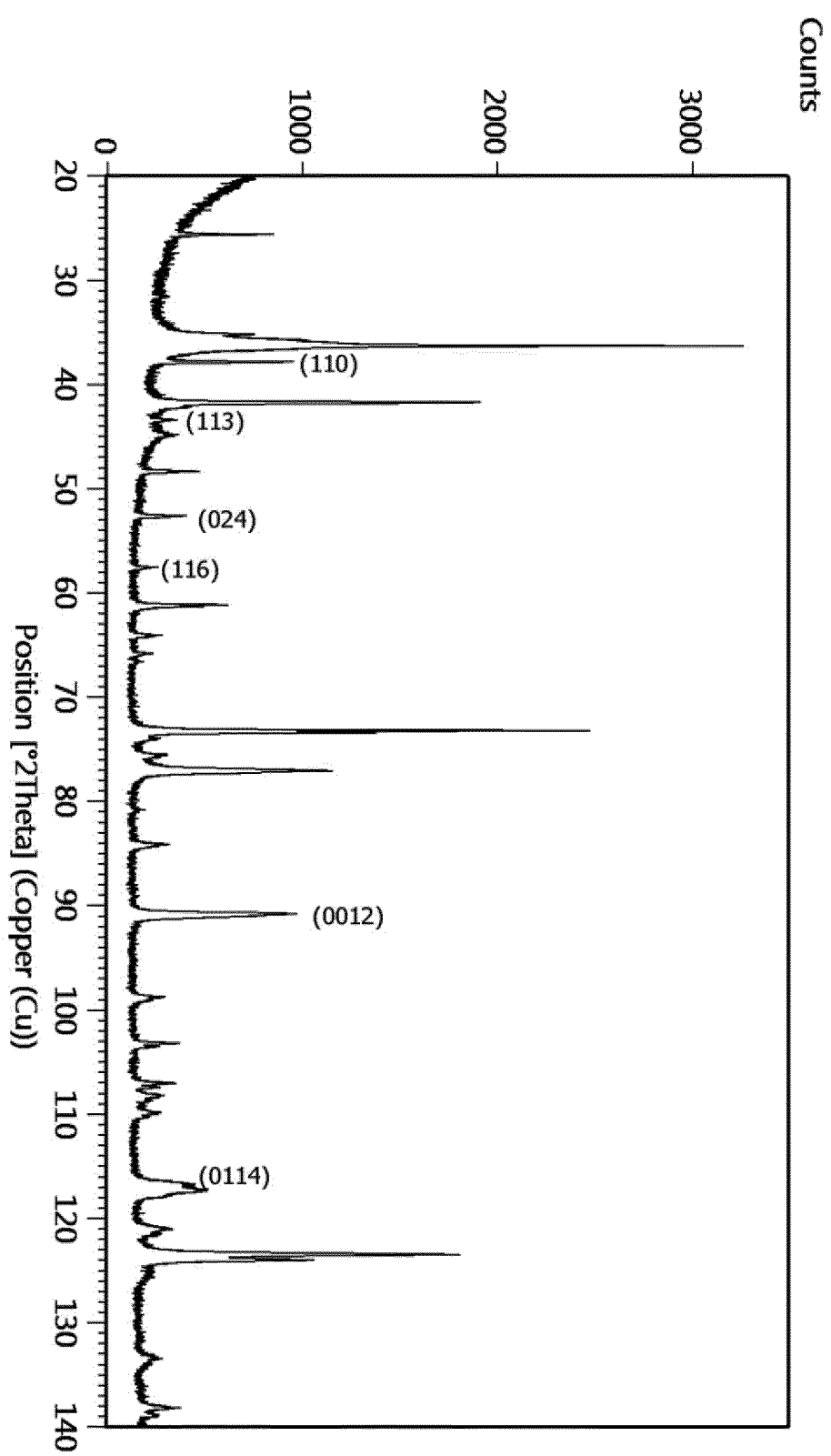
FIG. 12 is a XRD diffractogram of sample Multi A28u. No corrections are made to the intensity data and no Cu—K$_{\alpha 2}$ stripping applied. The peaks 110, 113, 024, 116, 0 0 12 and 0 1 14 originating from Al$_2$O$_3$ are indicated in the figure.
Figure 13:
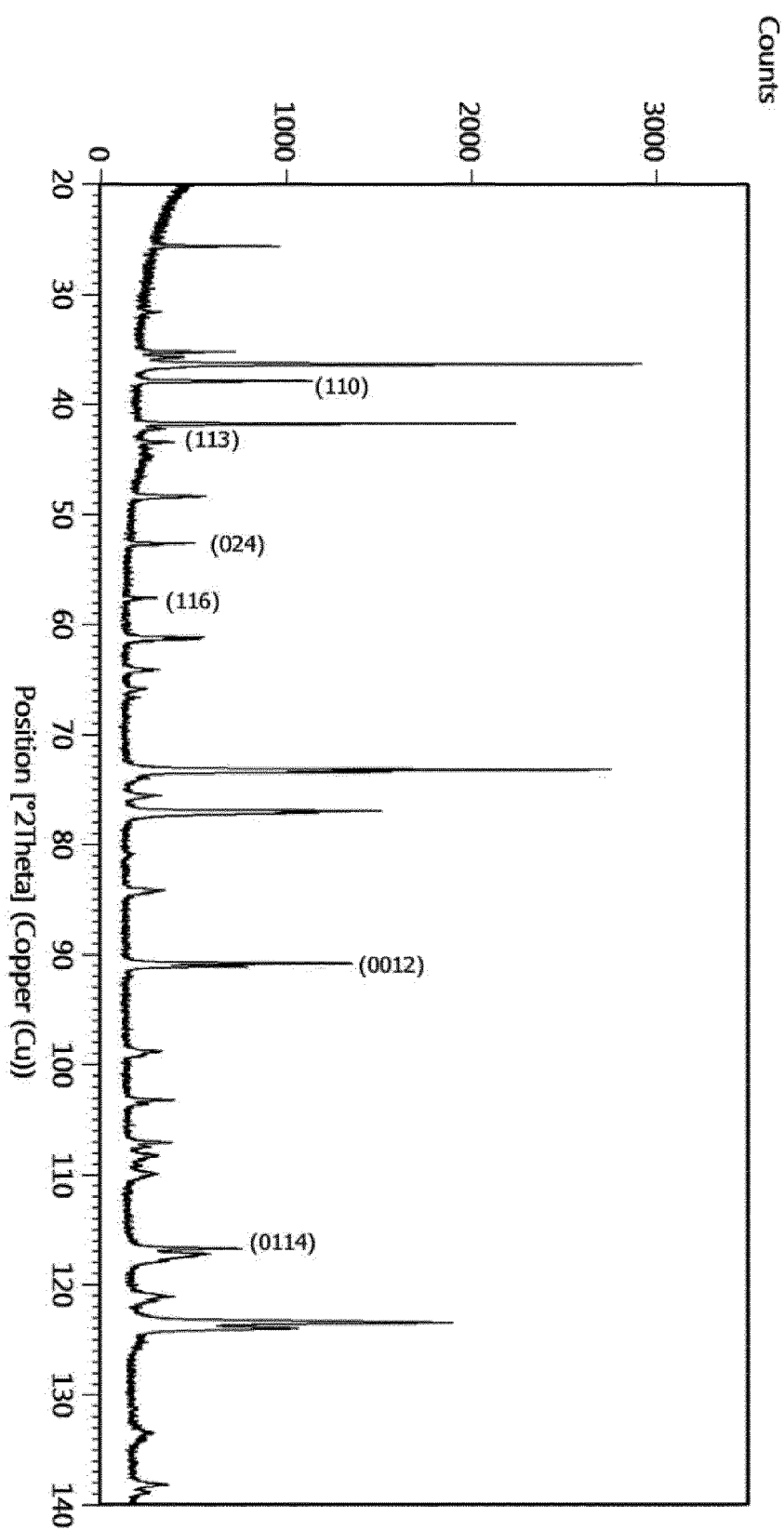
FIG. 13 is a XRD diffractogram of sample Single A1. No corrections are made to the intensity data and no Cu—K$_{\alpha 2}$ stripping applied. The peaks 110, 113, 024, 116, 0 0 12 and 0 1 14 originating from Al$_2$O$_3$ are indicated in the figure.

XRD analyses were made as disclosed in the method section above. No thin film correction was applied to the intensity data. The intensities of the peaks 110, 113, 024, 116, 0 0 12 and 0 1 14 originating from $\alpha\text{-}Al_2O_3$ for the samples are presented in Table 3 with the values normalized such that the intensity of 0 0 12 was set to 100%. The XRD diffractogram of samples Multi A28u and Single A1 are shown in FIGS. 12 and 13, respectively.

TABLE 3

| Sample | XRD intensities originating from α-Al$_2$O$_3$ | | | | | |
|---|---|---|---|---|---|---|
| | I(110) | I(113) | I(024) | I(116) | I(0 0 12) | I(0 1 14) |
| Single A1 | 48.8 | 10.0 | 19.3 | 9.1 | 100.0 | 69.4 |
| Multi A6 | 35.2 | 3.9 | 10.8 | 4.5 | 100.0 | 49.4 |
| Multi A24 | 36.5 | 4.9 | 12.5 | 6.7 | 100.0 | 61.7 |
| Multi A26 | 40.5 | 2.8 | 12.1 | 5.2 | 100.0 | 48.9 |
| Multi A32 | 48.8 | 5.5 | 14.0 | 5.3 | 100.0 | 51.7 |
| Multi A56 | 56.0 | 4.4 | 18.1 | 7.9 | 100.0 | 46.9 |
| Multi A28u | 33.5 | 4.6 | 12.9 | 5.7 | 100.0 | 51.4 |
| Multi A40u | 92.8 | 15.5 | 30.3 | 18.6 | 100.0 | 61.0 |
| Single B1 | 16.0 | 2.1 | 6.1 | 2.5 | 100.0 | 41.6 |
| Multi B38 | 14.3 | 2.3 | 4.7 | 1.6 | 100.0 | 28.1 |
| Multi B58 | 12.6 | 1.2 | 4.9 | 1.5 | 100.0 | 24.0 |

The TiCN layer located between the substrate and the α-Al$_2$O$_3$-single layer of sample Single A1 was studied in XRD. Subsequent to thin film correction and correction for absorption in the single α-Al$_2$O$_3$-layer of the data, the TC values were calculated using Harris formula. The results are shown in Table 4.

Harris Formula:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (integrated area) of the (hkl) reflection, I$_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0), (4 2 2) and (5 1 1).

TABLE 4

| h k l | TC(h k l) |
|---|---|
| 2 2 0 | 0.2 |
| 3 1 1 | 2.0 |
| 4 2 2 | 3.5 |

A corresponding TiCN layer was also present in all the samples provided with the α-Al$_2$O$_3$-multilayers. The XRD diffractograms of the α-Al$_2$O$_3$-multilayers indicate a broad 111 reflection seen at about 36.1° in the XRD diffractogram whereby it could be concluded that the origin for this reflection should be the TiCO sublayers. XRD signal from the TiCO sublayers and signals from the TiCN layer is difficult to separate in analyzing the layers since both the TiCO and the TiCN are cubic with similar cell parameters. To analyze the TiCN layer the α-Al$_2$O$_3$-multilayers should first be removed by mechanical or chemical means such as etching or polishing. Thereafter the TiCN layer can be analyzed.

STEM

In order to investigate the protrusions of the sublayer, HAADF STEM analysis was made in a monochromated, aberration probe corrected Titan 80-300 TEM/STEM.

Figure 10:
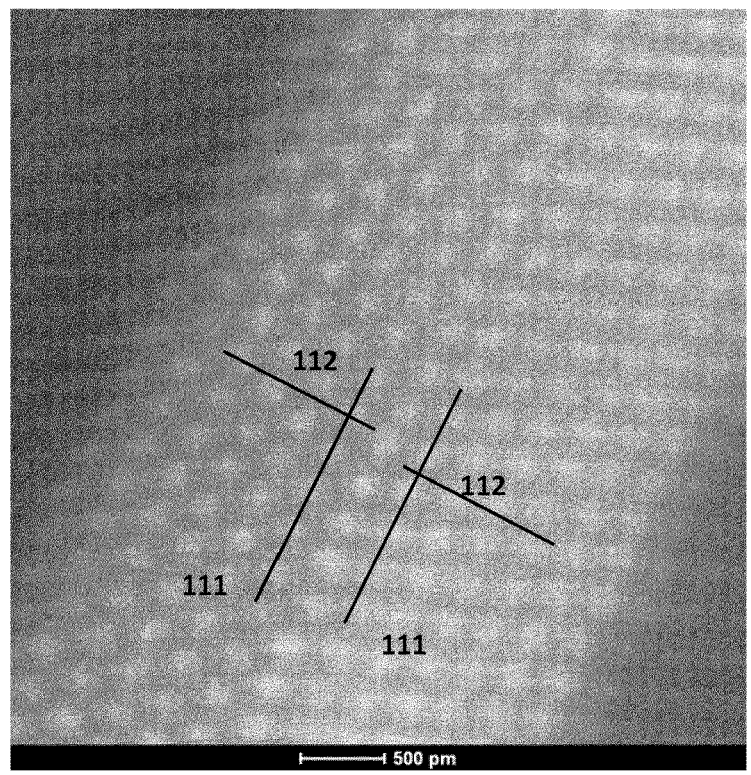
FIG. 10 is a HAADF Scanning Transmission Electron Microscope (HAADF STEM) image of a cross section of a protrusion of the TiCO sub layer of the coating of sample Multi A32. The 111 plane and the 112 plane are indicated with lines in the figure. View is aligned along the 011 zone axis.
Figure 11:
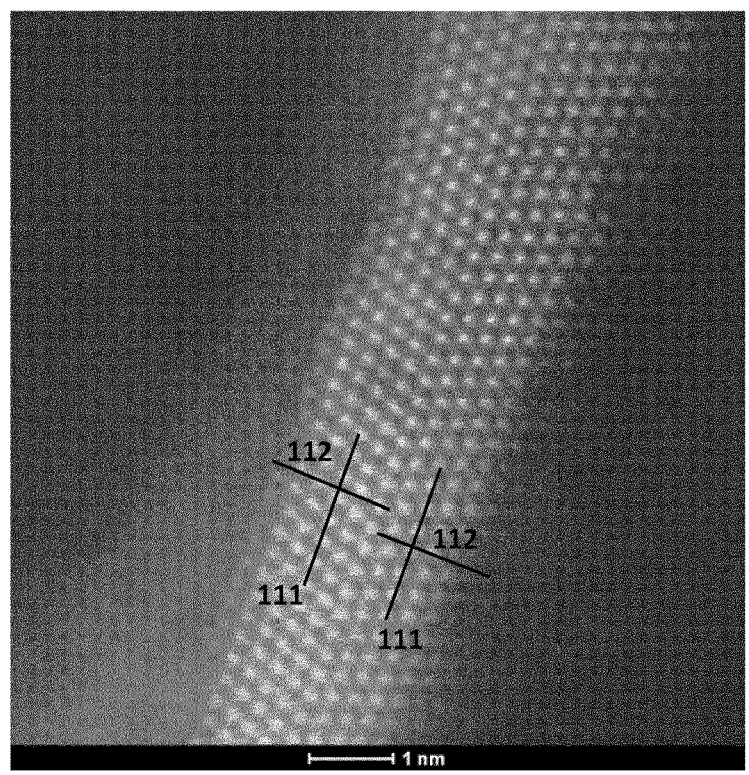
FIG. 11 is a HAADF Scanning Transmission Electron Microscope (HAADF STEM) image of a cross section of a protrusion of the TiCO sub layer of the coating of sample Multi A32. The 111 plane and the 112 plane are indicated with lines in the figure. View is aligned along the 011 zone axis.

Specimens were prepared in accordance with the method disclosed in the method section above. Several protrusions of the TiCO sublayer in the α-Al$_2$O$_3$-multilayer were studied with STEM. The protrusions were handled as of cubic crystal structure and were aligned along its zone axis 011. It was found that the protrusions comprised a twin boundary. The twin boundary was a 111 plane and the protrusion was extended in its <211> direction. HAADF STEM images of sample Multi A32 are shown in FIGS. 10 and 11.

Wear Tests

A blasting was performed on the rake faces of the coated cutting tools prior to the wear tests. The blaster slurry used consisted of 20 vol-% alumina in water and an angle of 90 deg. between the rake face of the cutting insert and the direction of the blaster slurry. The pressure of the slurry to the gun was 1.8 bar for all wear tested samples.

PD Impression

The samples were tested in a dry turning test cutting in work piece material SS2541 (a 700×180 mm bar). Face turning was applied on said bar from a diameter of 178 mm to a diameter of 60 mm. The following cutting data was used:

Cutting speed, V$_c$: 200 m/min
Feed, f$_z$: 0.35 mm/revolution
Cutting depth, a$_p$: 2 mm The stop criterion was defined as when the flank wear (Vb)≥0.5 mm or at edge breakage. The flaking is considered to occur mainly due to plastic deformation of the cutting edge. Each insert edge was inspected after each 5 cuts and the flank wear on the main edge and on the secondary edge was measured. When the flank wear reached a value of 0.4 mm the cutting edge was inspected after each 3 cuts.

The number of cuts at Vb=0.3 mm (an interpolated value) and the number of cuts before flaking due to plastic deformation of cutting edge in relation to the total number of cuts when stop criterion was reached is shown in Table 5.

TABLE 5

| Sample | Number of cuts at Vb = 0.3 mm | Total number of cuts | Number of cuts when flaking of coating was observed |
|---|---|---|---|
| Single A1 | 43.33 | 58 | 58 |
| Multi A6 | 45.00 | 61 | 58 |
| Multi A24 | 46.67 | 58 | 50 |
| Multi A26 | 53.57 | 73 | 55 |
| Multi A32 | 45.00 | 64 | 50 |
| Multi A56 | 47.50 | 64 | 45 |
| Multi A28u | 50.83 | 64 | >64 (no flaking observed at end of test) |
| Multi A40u | 52.22 | 67 | >67 (no flaking observed at end of test) |

It was concluded that the samples Multi A28u and Multi A40u were the samples that did show the highest resistance to flaking in this test and that all the multilayered samples showed a higher flank wear resistance as compared to the reference Single A1.

PD Depression

The samples were tested in longitudinal turning at dry conditions in a work piece material SS2541 (a 700×180 mm bar). The following cutting data was used:
Cutting speed, $V_c$: 98 or 110 m/min
Feed, $f_z$: 0.7 mm/revolution
Cutting depth, $a_p$: 2 mm
Time in cut: 30 s Before starting the test, the insert was placed in a fixture and the position of the cutting edge on the nose is set to zero via a dial gauge. After 30 seconds cutting time the new position of the cutting edge on the nose was measured by the dial gauge giving a value of the edge depression. The worn edges were studied in a light microscope and the degree of flaking in relation to the reference sample A1 was noted. The average results of 3 parallel pd-depression cutting test are shown in Table 6.

TABLE 6

| Sample | Edge depression [μm] (98 m/min) | Edge depression [μm] (110 m/min) | Judgement of flaking in relation reference |
|---|---|---|---|
| Single A1 | 33 | 41 | Reference |
| Multi A6 | 38 | 41 | Worse |
| Multi A24 | 31 | 35 | Similar |
| Multi A26 | 27 | 32 | Better |
| Multi A32 | 31 | 35 | Similar |
| Multi A56 | 30 | 36 | Similar |
| Multi A28u | 29 | 31 | Better |
| Multi A40u | 30 | 35 | Better |

It was concluded that the sample Multi A6 did not resist this cutting test better than the reference Single A1, while all the other samples did perform similar or better.

While the invention has been described in connection with various exemplary embodiments, it is to be understood that the invention is not to be limited to the disclosed exemplary embodiments, on the contrary, it is intended to cover various modifications and equivalent arrangements within the appended claims. Furthermore, it should be recognized that any disclosed form or embodiment of the invention may be incorporated in any other disclosed or described or suggested form or embodiment as a general matter of design choice. It is the intention, therefore, to be limited only as indicated by the scope of the appended claims appended hereto.

The invention claimed is:

1. A coated cutting tool comprising:
a substrate; and
a coating, wherein the coating comprises an $\alpha$-$Al_2O_3$-multilayer consisting of alternating sublayers of $\alpha$-$Al_2O_3$ and sublayers of TiCO, TiCNO, AlTiCO or AlTiCNO, said $\alpha$-$Al_2O_3$-multilayer including at least 5 sublayers of $\alpha$-$Al_2O_3$, wherein a total thickness of said $\alpha$-$Al_2O_3$-multilayer is 1-15 μm, and wherein a period in the $\alpha$-$Al_2O_3$-multilayer is 50-900 nm, wherein the $\alpha$-$Al_2O_3$-multilayer exhibits an XRD diffraction over a θ-2θ scan of 20°-140°, wherein a relation of an intensity of the 0 0 12 diffraction peak (peak area), I(0 0 12), to intensities of the 1 1 3 diffraction peak (peak area), I(1 1 3), the 1 1 6 diffraction peak (peak area), I(1 1 6), and the 0 2 4 diffraction peak (peak area), I(0 2 4), is I(0 0 12)/I(1 1 3)>1, I(0 0 12)/I(1 1 6)>1 and I(0 0 12)/I(0 2 4)>1.

2. The coated cutting tool of claim 1, wherein an intensity of the 0 1 14 diffraction peak (peak area), I(0 1 14), to the intensity of the 0 0 12 diffraction peak (peak area), I(0 0 12), is I(0 1 14)/I(0 0 12)<2.

3. The coated cutting tool of claim 1, wherein a relation of the intensity of the 1 1 0 diffraction peak (peak area), I(1 1 0), to the intensities of the 1 1 3 diffraction peak (peak area), I(1 1 3), and the 0 2 4 diffraction peak (peak area), I(0 2 4), is 4110)>each of I(113) and I(024).

4. The coated cutting tool of claim 1, wherein the relation of the intensity of the 0 0 12 diffraction peak (peak area), I(0 0 12), to the intensity of the 1 1 0 diffraction peak (peak area), I(1 1 0), is I(0 0 12)>I(110).

5. The coated cutting tool of claim 1, wherein the TiCO, TiCNO, AlTiCO or AlTiCNO sublayer include protrusions, wherein said protrusions are crystalline.

6. The coated cutting tool of claim 5, wherein said protrusions have at least one twin boundary, and wherein the protrusions share a (111) plane and are extended in a <211> direction.

7. The coated cutting tool of claim 5, wherein a length of said protrusions in an extended direction is 10-100 nm.

8. The coated cutting tool of claim 5, wherein a height of said protrusions as measured in a direction perpendicular to a surface normal of the substrate is less than a period of the multilayer.

9. The coated cutting tool of claim 1, wherein an average thickness of said $\alpha$-$Al_2O_3$ sublayer is 40-800 nm.

10. The coated cutting tool of claim 1, further comprising a first $\alpha$-$Al_2O_3$-layer located between the substrate and the $\alpha$-$Al_2O_3$-multilayer, the first $\alpha$-$Al_2O_3$-layer being in direct contact with the $\alpha$-$Al_2O_3$-multilayer, wherein the thickness of said $\alpha$-$Al_2O_3$-layer is <1 μm.

11. The coated cutting tool of claim 1, further comprising at least one layer of TiC, TiN, TiAlN or TiCN located between the substrate and the $\alpha$-$Al_2O_3$-multilayer.

12. The coated cutting tool of claim 11, wherein a thickness of the TiC, TiN, TiAlN or TiCN layer is 2-15 μm.

13. The coated cutting tool of claim 1, wherein an outermost layer of the coating is an $\alpha$-$Al_2O_3$ layer.

14. The coated cutting tool of claim 1, wherein the substrate is cemented carbide, cermet, ceramic, high speed steel or cBN.

15. The coated cutting tool of claim 1, wherein the substrate is cemented carbide comprising 3-14 wt % Co and more than 50 wt % WC.

16. The coated cutting tool of claim 8, wherein the surface normal of the substrate is less than 80% of the period of the multilayer.

* * * * *